United States Patent
Barak

(10) Patent No.: US 6,828,862 B2
(45) Date of Patent: Dec. 7, 2004

(54) RF POWER AMPLIFIER WITH LOW INTERMODULATION DISTORTION AND REDUCED MEMORY EFFECT

(75) Inventor: Ilan Saul Barak, Kfar Saba (IL)

(73) Assignee: Wiseband Communications Ltd., Yakum (IL)

(*) Notice: Subject to any disclaimer, the term of this patent is extended or adjusted under 35 U.S.C. 154(b) by 0 days.

(21) Appl. No.: 10/385,783

(22) Filed: Mar. 11, 2003

(65) Prior Publication Data

US 2004/0178853 A1 Sep. 16, 2004

(51) Int. Cl.[7] ................................................ H03F 3/04
(52) U.S. Cl. ........................ 330/302; 330/277; 333/33
(58) Field of Search ............................... 330/302, 277, 330/285, 296, 303, 306, 56, 57; 33/32, 33

(56) References Cited

U.S. PATENT DOCUMENTS

| | | | |
|---|---|---|---|
| 5,272,450 A | | 12/1993 | Wisherd |
| 5,592,122 A | * | 1/1997 | Masahiro et al. ............ 330/286 |
| 5,805,023 A | * | 9/1998 | Fukuden ...................... 330/302 |
| 5,905,409 A | * | 5/1999 | Fujimoto et al. ............ 330/302 |
| 5,999,058 A | | 12/1999 | Saitou et al. |
| 6,081,160 A | | 6/2000 | Custer et al. |
| 6,111,461 A | | 8/2000 | Matsuno |
| 6,346,859 B1 | | 1/2002 | Saitou |
| 2002/0067212 A1 | | 6/2002 | Takenaka |

OTHER PUBLICATIONS

Takenaka, et al, "Improved IMD Characteristics in L/S-Band GaAs FET Power Amplifiers by Lowering Drain Bias Circuit Impedance", IEICE Transactions on Electronics E82-C(5), pp. 730-736, May 1999.

P.M. Asbeck, et al, "Augmented Behavioral Characterization for Modeling the Nonlinear Response of Power Amplifiers", pp. 135-138, 2002 IEEE MTT-S CDROM.

* cited by examiner

Primary Examiner—Henry Choe
(74) Attorney, Agent, or Firm—Welsh & Katz, Ltd.

(57) ABSTRACT

A raido-frequency (RF) power amplifier includes an active device, having an input port, which is coupled to receive an RF input signal having a center frequency $f_0$ and a single-sided bandwidth BW, and an output port, which is characterzed by an output capacitance $C_1$ and is coupled to output an amplified RF signal, responsive to the input signal, with a peak output power $P_{out}$. A distortion suppression circuit is coupled between the output port and a ground, and includes a transmission line having a characteristic impedance $Z_0$ that is selected so as to substantially satisfy a condition that $$Z_0 \leq \frac{f_0}{\pi BW} \cdot \frac{1}{\sqrt{\frac{P_{out}}{11.3} + 4\pi BW \cdot C_1}}.$$

33 Claims, 3 Drawing Sheets

RF POWER AMPLIFIER WITH LOW INTERMODULATION DISTORTION AND REDUCED MEMORY EFFECT

FIELD OF THE INVENTION

The present invention relates generally to power amplifiers, and specifically to reduction of intermodulation distortion and its dependence on difference frequency in wideband RF power amplifiers.

BACKGROUND OF THE INVENTION

Wideband radio frequency (RF) power amplifiers must commonly amplify signals on multiple, adjacent carriers with high gain and linearity. For example, power amplifiers used in WCDMA base stations are required to amplify signals over a 20 MHz bandwidth in the 2 GHz range. Intermodulation distortion (IMD) is a well-known problem in such amplifiers, stemming from third-order (and higher-order) interaction between different carriers. IMD results from undesired amplification of intermodulation products at the difference frequencies $\Delta f$ between different carriers in the wideband signal. Another, related problem in power amplifiers is the memory effect, which causes the amplifier output to depend not simply on the present input signal, but on the history of the signal over a certain time period. The dependence of IMD in a power amplifier on the difference frequency $\Delta f$ is indicative of the presence of memory effect in the power amplifier, as well.

Power amplifiers based on Field Effect Transistors (FETs) commonly use a DC bias on the drain of the FET to improve linearity. In order to prevent loading of the FET output at the RF carrier frequency, the DC bias source is connected to the drain by a transmission line having a high impedance at the carrier frequency. Typically, to satisfy this objective, the length of the transmission line is one-quarter wavelength at the carrier frequency. On the other hand, to reduce IMD, it is desirable that the drain bias circuit have a low impedance at the difference frequency $\Delta f$, so that intermodulation products are shunted to ground through this circuit. These impedance requirements tend to conflict.

Various drain bias circuit designs have been proposed for the purpose of reducing IMD. For example, U.S. Pat. No. 5,272,450, to Wisherd, whose disclosure is incorporated herein by reference, describes a DC feed network for a wideband RF power amplifier, using a shunt capacitor in parallel with a choke coil to connect a DC power source to the active device of the amplifier. The cutoff frequency of the bias network can be adjusted so that sum and difference frequencies of multiple-input signals to the amplifier are not attenuated by the feed network. The sum and difference frequencies are thus shunted to ground.

As another example, U.S. Pat. No. 6,081,160, to Custer et al., whose disclosure is also incorporated herein by reference, describes a the use of a bias feed line to couple a DC bias circuit to an active device, wherein a dielectric member is placed adjacent to the bias feed line. The dielectric member is designed to maintain high RF impedance in the bias feed line, while reducing impedance at lower frequencies. The physical length of has an effective length of a quarter wavelength at the RF carrier frequency.

Takenaka et al. have studied the relationship between drain bias circuit impedance and IMD, as described in their article, "Improved IMD Characteristics in L/S-Band GaAs FET Power Amplifiers by Lowering Drain Bias Circuit Impedance," IEICE Transactions on Electronics E82-C(5), pages 730–736 (May, 1999), which is incorporated herein by reference. The authors showed experimentally that distortion characteristics, such as IMD, are degraded when the absolute value of the drain bias circuit impedance at low frequency is high. Measured IMD in the output of an experimental amplifier was found to increase with bias circuit impedance above a critical impedance value Rc, which was determined empirically. The IMD was also found to increase with increasing frequency spacing $\Delta f$ between carrier tones.

It is also possible to use an additional filtering circuit, coupled to the drain of the active device in parallel with the drain bias circuit, in order to suppress beat frequencies between different RF carriers. Such arrangements are described, for example, in U.S. Pat. No. 5,999,058, to Saitou et al., and in U.S. Pat. No. 6,346,859, to Saitou, both of which are incorporated herein by reference. In the amplifiers disclosed in these patents, a DC bias voltage is coupled to the drain through a quarter-wavelength transmission line. The additional filtering circuit (referred to as a filter block or beat-smoothing circuit) comprises a microstrip line or low-pass filter, which is coupled to ground through a capacitor, and which provides a low impedance at the beat frequency between carrier frequencies.

SUMMARY OF THE INVENTION

Embodiments of the present invention provide a method for designing the drain circuit of a RF power amplifier so as to minimize IMD and its dependence on the frequency spacing $\Delta f$. This method is thus also useful in reducing the memory effect in such amplifiers. The power amplifier comprises an active device, typically a FET, with a drain bias circuit coupling the output port of the active device to a DC supply. The method of the present invention is based on the realization that the baseband load impedance of the output port and bias circuit, taken together, can be modeled as a pi-type network, having a resonant frequency. IMD suppression is achieved by setting the parameters of the network so that the resonant frequency is greater than the total bandwidth of the RF signal.

In some embodiments of the present invention, IMD suppression is achieved by means of a suitable transmission line in the bias circuit, or in parallel with the bias circuit, which is typically coupled to a bypass capacitor. In order to achieve the desired resonant frequency in the pi-network, characteristic impedance of the transmission line is set to be less than or equal to a threshold value, which is determined by the operating parameters of the amplifier, including the center frequency, bandwidth, peak power and output capacitance of the active device. Alternatively, a suitable inductor may be used for this purpose. As a result, third-order (and higher-order) intermodulation products are suppressed in the amplifier output.

There is therefore provided, in accordance with an embodiment of the present invention, a radio-frequency (RF) power amplifier, including:

an active device, which includes:
an input port, which is coupled to receive an RF input signal having a center frequency $f_0$ and a single-sided bandwidth BW; and
an output port, which is characterized by an output capacitance $C_1$ and is coupled to output an amplified RF signal, responsive to the input signal, with a peak output power $P_{out}$; and
a distortion suppression circuit, which is coupled between the output port and a ground, and includes a transmission line having a characteristic impedance $Z_0$ that is selected so as to substantially satisfy a condition that $$Z_0 \leq \frac{f_0}{\pi BW} \cdot \frac{1}{\sqrt{\frac{P_{out}}{11.3} + 4\pi BW \cdot C_1}}.$$

Typically, the transmission line has a length that is approximately equal to one quarter wavelength at the center frequency $f_0$.

Additionally or alternatively, the distortion suppression circuit includes a bypass capacitor, including first and second terminals, wherein the transmission line is coupled between the output port of the active device and the first terminal of the capacitor, and the second terminal of the capacitor is connected to the ground. Typically, the bypass capacitor has a capacitance that is at least twice the output capacitance $C_1$.

In a disclosed embodiment, a direct current (DC) bias is supplied to the output port of the active device via the transmission line included in the distortion suppression circuit.

The distortion suppression circuit may include a plurality of cascaded transmission lines, which includes the transmission line having the characteristic impedance $Z_0$.

Typically, the distortion suppression circuit has an input impedance $Z_L$ in a baseband frequency range satisfying $$|Z_L| \leq 0.3 \sqrt{\frac{125}{P_{out}}}.$$

In embodiments of the invention, the transmission line may include a plurality of parallel conductive traces formed on a circuit substrate or a conductive rail, which is produced above a circuit substrate.

Typically, the active device includes a Field Effect Transistor (FET), and the RF input signal includes a code division multiple access (CDMA) signal.

There is also provided, in accordance with an embodiment of the present invention, a radio-frequency (RF) power amplifier, including:

an active device, which includes:
an input port, which is coupled to receive an RF input signal having a center frequency $f_0$ and a single-sided bandwidth BW; and
an output port, which is characterized by an output capacitance $C_1$ and is coupled to output an amplified RF signal, responsive to the input signal, with a peak output power $P_{out}$; and
a distortion suppression circuit, which is coupled between the output port and a ground, and includes an inductor having an inductance L that is selected so as to substantially satisfy a condition that $$L \leq \frac{1_0}{4\pi BW} \cdot \frac{1}{\sqrt{\frac{P_{out}}{11.3} + 4\pi BW \cdot C_1}}.$$

There is additionally provided, in accordance with an embodiment of the present invention, a method for producing a radio-frequency (RF) power amplifier to operate at a center frequency $f_0$ with a single-sided bandwidth BW, using an active device that includes an input port for receiving an RF input signal having, and an output port, which is char-acterized by an output capacitance $C_1$ and is coupled to output an amplified RF signal, responsive to the input signal, with a peak output power $P_{out}$, the method including:

determining a characteristic impedance $Z_0$ that is given by $$Z_0 \leq \frac{f_0}{\pi BW} \cdot \frac{1}{\sqrt{\frac{P_{out}}{11.3} + 4\pi BW \cdot C_1}};$$

and
coupling a distortion suppression circuit including a transmission line having the characteristic impedance $Z_0$ between the output port of the active device and a ground.

There is further provided, in accordance with an embodiment of the present invention, a method for producing a radio-frequency (RF) power amplifier to operate at a center frequency $f_0$ with a single-sided bandwidth BW, using an active device that includes an input port for receiving an RF input signal having, and an output port, which is characterized by an output capacitance $C_1$ and is coupled to output an amplified RF signal, responsive to the input signal, with a peak output power $P_{out}$, the method including:

determining an inductance L that is given by $$L \leq \frac{1}{4\pi BW} \cdot \frac{1}{\sqrt{\frac{P_{out}}{11.3} + 4\pi BW \cdot C_1}};$$

and
coupling a distortion suppression circuit including an inductor having the inductance L between the output port of the active device and a ground.

The present invention will be more fully understood from the following detailed description of the embodiments thereof, taken together with the drawings in which:

DETAILED DESCRIPTION OF EMBODIMENTS

Figure 1:
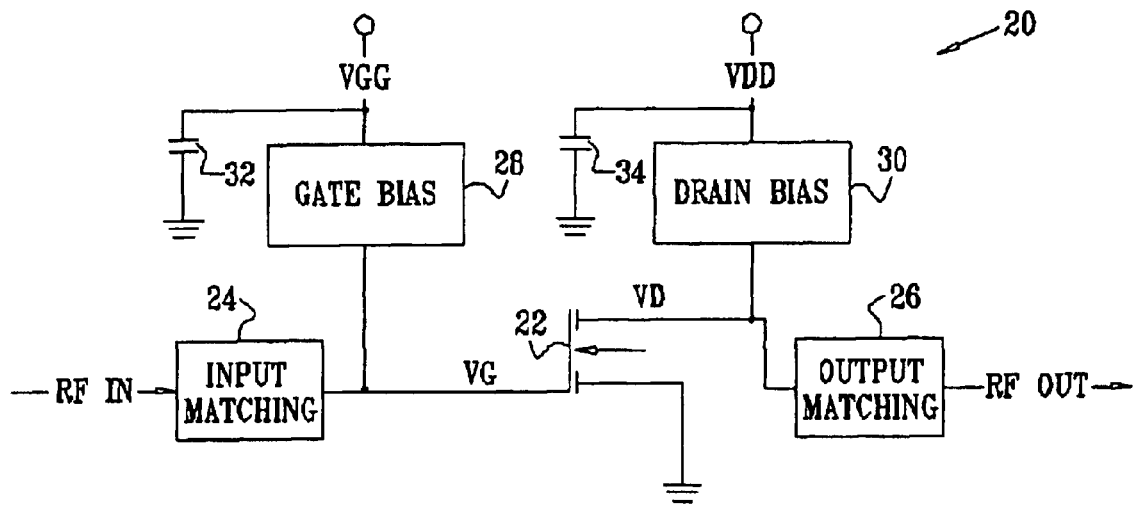
FIG. 1 is a block diagram that schematically illustrates a RF power amplifier, in accordance with an embodiment of the present invention.

FIG. 1 is a block diagram that schematically illustrates a RF power amplifier 20, in accordance with an embodiment of the present invention. Amplifier 20 is built around a FET 22, typically a LDMOS (laterally-diffused metal oxide semiconductor) power transistor, such as the MRF21130 device supplied by Motorola Semiconductor (Phoenix, Ariz.). FET 22 receives a RF input signal via an input matching circuit 24. The gate of the FET, which receives the input signal (i.e., the FET input port), is biased to a voltage $V_g$ by a gate bias supply voltage $V_{GG}$, which is applied through a gate bias circuit 28. The FET source is grounded.

The amplified RF signal appears at the drain (output port) of FET 22. The amplified signal is conveyed from the drain to the amplifier output through an output matching circuit 26. The drain is biased to a voltage $V_d$ by a drain bias supply voltage $V_{DD}$, which is applied through a drain bias circuit 30. The drain bias circuit also serves to suppress IMD in the amplifier output, as described in detail hereinbelow. Bypass capacitors 32 and 34 are typically connected between the gate and drain bias supplies and ground, as shown in the figure.

The dependence of the drain current Id of FET 22 on $V_g$ and $V_d$ can be estimated as follows, using a modified version of the well-known Curtice equation:

$$I_d = G_m(V_g - V_p)^{2*}(1 + \Lambda 1^* V_d^2 + \Lambda 2^* V_d^2)^* \tan(\alpha^* V_d) \quad (1)$$

Here $G_m$ is the device transconductance, $V_p$ is the gate pinchoff voltage, and $\Lambda 1$, $\Lambda 2$ and a are the FET device constants. Typically, for the above-mentioned LDMOS device, $G_m = 4.52$, $V_p = 3.25$ V, $\Lambda 1 = -0.00057$, $\Lambda 2 = 0.00011$ and $\alpha = 3.31$.

Modeling the input signal as $S = I(t)\cos(2\pi f_0 t) + Q(t)\sin(2\pi f_0 t)$, it can be seen that the drain current $I_d$ includes components at the center frequency $f_0$, at the second harmonic $2f_0$, and at baseband. Because the output of LDMOS devices is highly capacitive, it can be assumed that the drain impedance presented at $2f_0$ by matching circuit 26 and drain bias circuit 30 is approximately zero (so that the AC part of $V_d$ is 0). The baseband drain current is given by:

$$I_d = 0.5^* \; G_m^* (|I(t)|^2 + |Q(t)|^2) \quad (2)$$

The baseband signal thus includes frequencies up to the bandwidth limit of the modulation (I(t), Q(t)) of the RF signal. At baseband frequencies, however, the drain impedance is defined by drain bias circuit 30 and is not zero. Therefore, the drain voltage of FET 22 may include substantial baseband components, whose amplitudes are determined by the frequency dependence of the drain impedance. The baseband drain voltage re-modulates the signal at $f_0$ via the $\Lambda 2^* V_d^2$ term in equation (1), producing third-order IMD. Therefore, the impedance of circuit 30 is typically kept as low as possible over the entire baseband current bandwidth. Still, this low impedance at baseband frequencies by itself is not sufficient to minimize the IMD in the output of amplifier 20.

Figure 2:
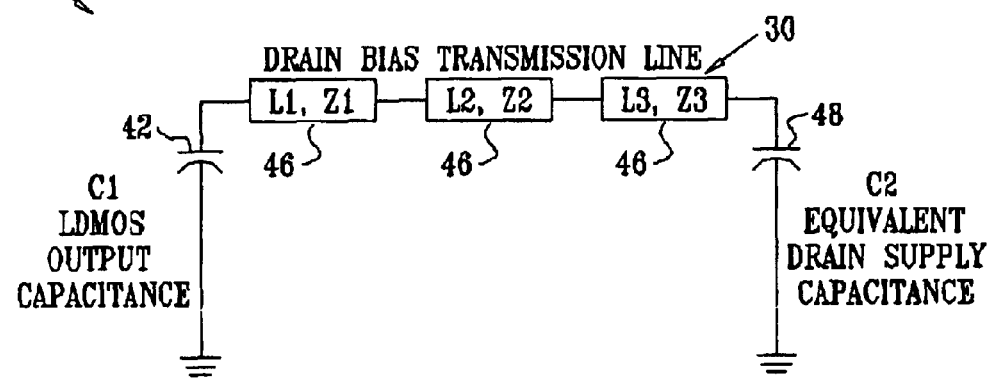
FIG. 2 is a schematic circuit diagram illustrating an equivalent drain circuit of a power amplifier, in accordance with an embodiment of the present invention.

FIG. 2 is a schematic circuit diagram showing an equivalent circuit 40 seen by the drain of FET 22, in accordance with an embodiment of the present invention. The large output capacitance of the LDMOS FET is represented by a capacitor 42 having a capacitance C1. Drain bias circuit 30 (FIG. 1) comprises a transmission line 46, or multiple cascaded transmission lines, as shown in the figure. Each transmission line has an electrical length L (L1, L2, ...) and a characteristic impedance Z (Z1, Z2, ...). Typically, the equivalent length of transmission lines 46 is one quarter-wavelength at the center frequency $f_0$, so that circuit 30 appears to be an open circuit at this frequency. Transmission lines 46 are coupled to ground through a bypass capacitor 48, having an equivalent capacitance C2. In practical amplifier designs, capacitor 48 may comprise multiple capacitors arranged in parallel.

It can be seen that circuit 40 is a pi-type network, with resonance characteristics that are analyzed further hereinbelow. The upper left corner of the network (between capacitor 42 and the first transmission line 46) corresponds to the drain of FET 22. The DC drain bias supply $V_{DD}$ is typically coupled to the upper right corner of the network, between the last transmission line 46 and capacitor 48. Alternatively, $V_{DD}$ may be coupled to circuit 40 at another suitable point, such as at the drain of FET 22, through a large inductance or through another transmission line, as described, for example, in the above-mentioned patents to Saitou.

Figure 3:
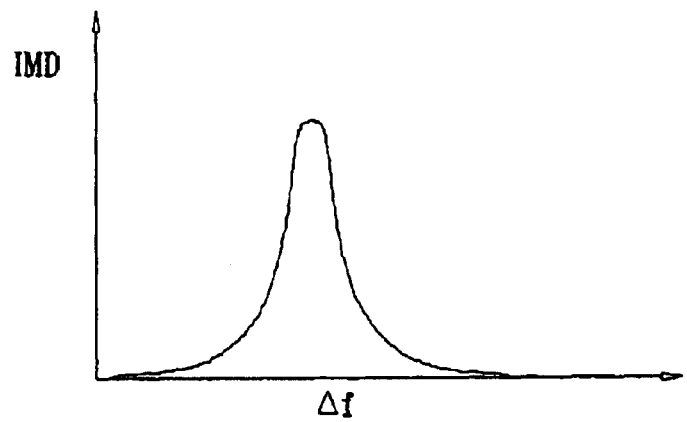
FIG. 3 is a schematic plot showing a dependence of intermodulation distortion (IMD) on the difference frequency between carriers in an amplified RF signal.

FIG. 3 is a schematic plot showing a dependence of IMD in amplifier 20 on the frequency difference $\Delta f$ between different carriers in a wideband RF signal that is input to the amplifier. The dependence of IMD on frequency is a result of the resonant behavior of circuit 40. To analyze this resonant behavior, we assume for simplicity that drain bias circuit 30 consists of a single transmission line 46, with characteristic impedance $Z_0$. The results of the analysis below, however, are similarly applicable to the more general case of cascaded transmission lines 46, as shown in FIG. 2.

For a given characteristic impedance $Z_0$ and center frequency $f_0$, the resonant frequency $f_r$ of circuit 40 is determined by solving the equation:

$$Z_0 \tan\left(\frac{\pi f_r}{2 f_0}\right) = \frac{1}{2\pi f_r C_{eq}} \quad (3)$$

wherein $C_{eq}$ is the equivalent capacitance of C1 in series with C2. While C1 is given by the characteristics of FET 22, C2 can be chosen arbitrarily by the designer of amplifier 20. C2 is typically at least twice C1, and may be much larger. Based on this assumption, and assuming small $f_r$ in comparison with $f_0$ (so that $\tan(\alpha) \cong \alpha$), the solution to equation (3) is:

$$f_r \cong \frac{1}{\pi}\sqrt{\frac{f_0}{C1 \cdot Z_0}} \quad (4)$$

To minimize IMD, this resonant frequency should be greater than the maximum frequency difference of interest in the input signal, namely $2^*BW$, wherein BW is the single-sided bandwidth of the modulated input signal.

Furthermore, the input impedance $Z_L$ of drain bias circuit 30, as seen from the drain of FET 22 (i.e., the upper left corner of the network in FIG. 2), should be kept low throughout the frequency range 0 to $2^*BW$. The inventor found that using an input impedance no greater than 0.3 ohm gave good results when FET 22 was a LDMOS transistor with peak output power $P_{out}$ of 125 W. Assuming that this impedance value is scalable with the drain current of the PET, a practical limit for the input impedance is given by:

$$|Z_L| \le 0.3 \sqrt{\frac{125}{P_{out}}} \quad (5)$$

The actual impedance $Z_L$ for circuit 30 can also be approximated using equation (4), along with its underlying assumptions, as:

$$|Z_L| = \frac{1}{\frac{2f_0}{Z_0 \pi f} - 2\pi f C1} \quad (6)$$

wherein f is the baseband frequency. Substituting equation (5) into equation (6), and substituting 2BW for f gives the following solution for $Z_0$:

$$Z_0 \leq \frac{f_0}{\pi BW} \cdot \frac{1}{\sqrt{\frac{P_{out}}{11.3}} + 4\pi BW \cdot C1} \quad (7)$$

For a four-carrier WCDMA signal in the 2.1 GHz band, having a BW of 10 MHZ, and using a 125W LDMOS FET with C1 =1000 pF, equation (7) indicates that minimal IMD will be achieved if $Z_0$ is no greater than 18.44 ohm.

Figure 4:
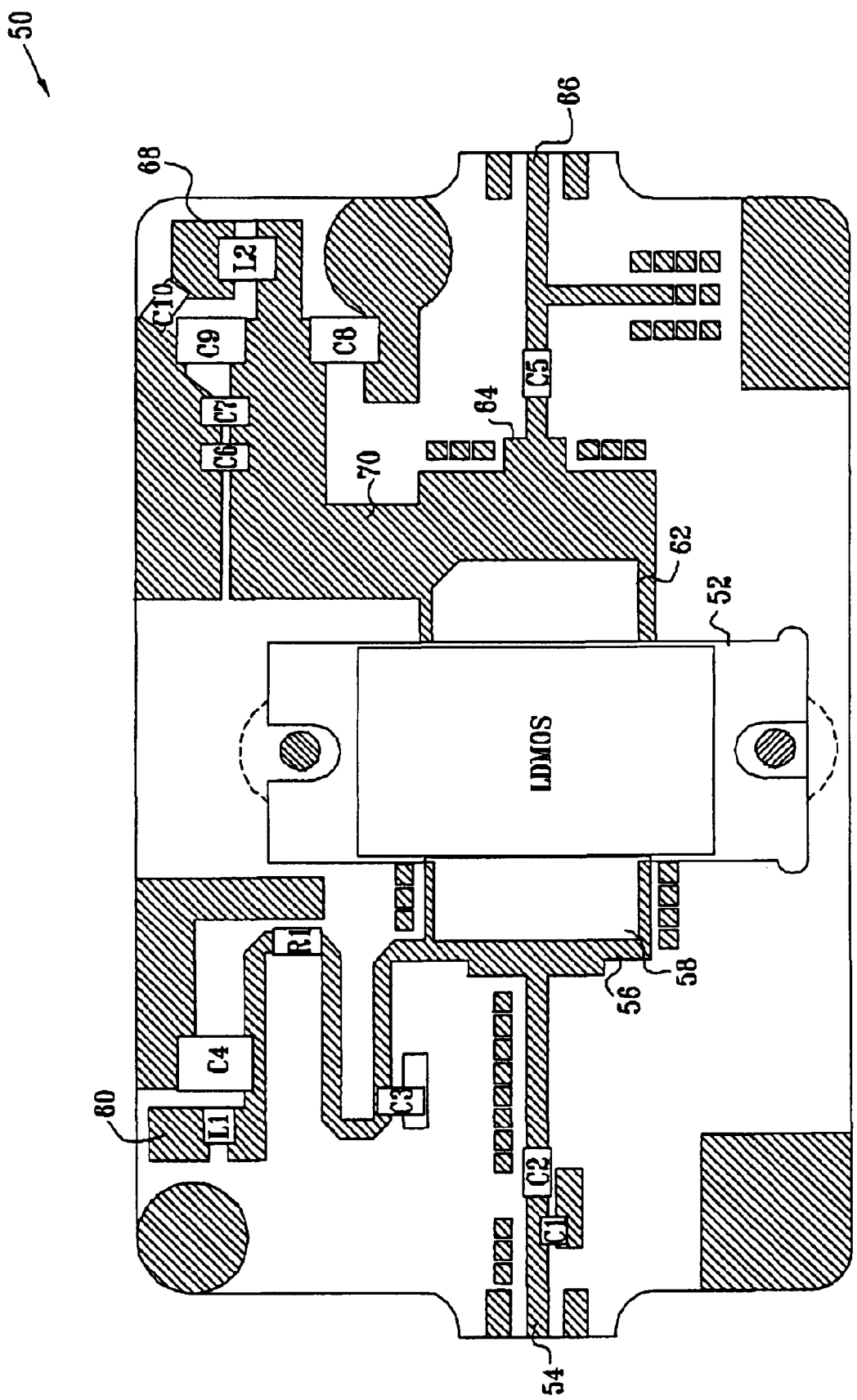
FIG. 4 is a schematic top view of a RF power amplifier circuit, in accordance with an embodiment of the present invention.

FIG. 4 is a schematic top view of a RF power amplifier circuit 50, designed on the basis of the principles defined above, in accordance with an embodiment of the present invention. Circuit 50 is built around a LDMOS FET 52, such as the Motorola MRF21130, mentioned above. Circuit 50 is produced on a dielectric substrate, with copper areas indicated by hatching in the figure. Circuit 50 receives a RF input signal from an input terminal 54, which is conveyed via an input matching network 56 to a gate 58 of FET 52. The gate bias voltage $V_{GG}$ is applied at a gate bias terminal 60. A drain 62 of FET 52 is coupled via an output matching network 64 to an output terminal 66. The drain bias voltage $V_{DD}$ is applied at a drain bias terminal 68, via a drain line 70, to drain 62. The length of drain line 70 is chosen to be one quarter-wavelength at the center frequency of circuit 50, while the width and other characteristics are chosen so as to satisfy equation (7). The discrete circuit components shown in the figure may have the values given in Table I below.

TABLE I

| CIRCUIT COMPONENT VALUES | |
|---|---|
| R1 = 100 Ω | C7 = 4700 pF |
| C1 = 1 pF | C8 = 1 μF |
| C2 = 4.7 pF | C9 = 1 μF |
| C3 = 4.7 pF | C10 = 4.7 pF |
| C4 = 1 μF | L1 = 8.2 nH |
| C5 = 10 pF | L2 = 8.2 nH |
| C6 = 4.7 pF | C8 = 1 μF |

Other design approaches may also be used to meet the requirement that drain bias circuit 30 have a low characteristic impedance. For example, the cascaded transmission lines 46 shown in FIG. 2 can be designed to satisfy equation (5) at baseband frequencies, as well as providing the required high impedance at the carrier frequency. At least one of the transmission lines in the cascade should have a characteristic impedance satisfying equation (7). The use of cascaded transmission lines provides the designer with additional degrees of freedom, which may make it easier to meet dimensional constraints of the circuit board on which the amplifier is produced.

Figure 5:
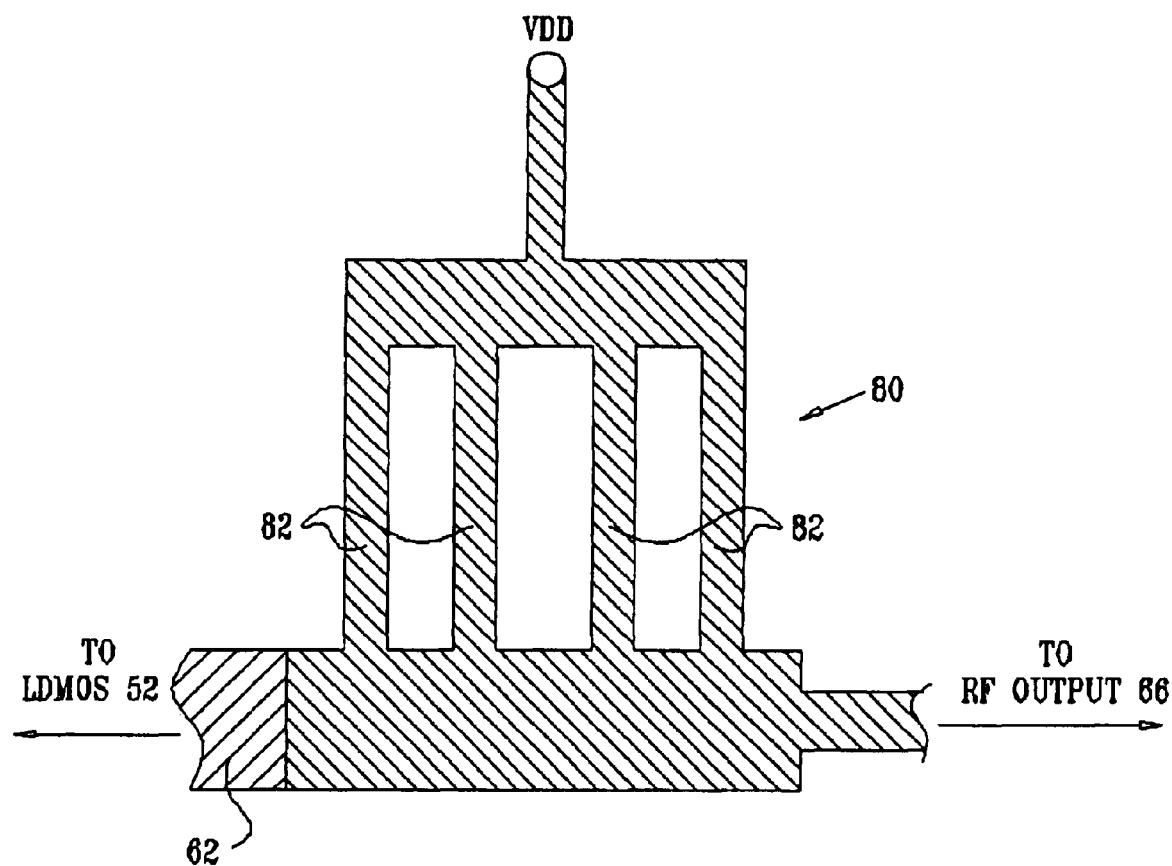
FIG. 5 is a schematic top view of a drain bias transmission line for use in a RF power amplifier, in accordance with an embodiment of the present invention.

FIG. 5 is a schematic top view of a drain bias network 80, in accordance with another embodiment of the present invention. In this case, to meet the impedance requirements defined above, network 80 comprises multiple parallel conductive lines 82 on the amplifier circuit board.

Figure 6:
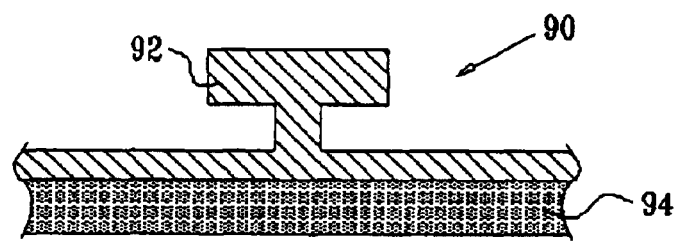
FIG. 6 is a schematic sectional view of a drain bias transmission line for use in a RF power amplifier, in accordance with another embodiment of the present invention.

FIG. 6 is a schematic, sectional view of a portion of a drain bias line 90, in accordance with yet another embodiment of the present invention. Here line 90 comprises a conductive rail 92, which is produced above a substrate 94. Again, the shape of rail 92 is chosen so as to meet the impedance requirements defined above.

In a further alternative embodiment of the present invention, drain bias circuit 30 may comprise an inductor or cascaded inductors as the DC feed element, instead of a transmission line. In this case, the equivalent inductance of circuit 30 should satisfy the following rule, which is derived in a manner similar to equation (7):

$$L \leq \frac{1}{4\pi BW} \cdot \frac{1}{\sqrt{\frac{P_{out}}{11.3}} + 4\pi BW \cdot C1} \quad (8)$$

Although in the embodiments described above, drain bias circuit 30 is used for IMD suppression, the principles of the present invention are equally applicable when a separate filter element, in parallel with the drain bias line, is used for this purpose, as noted above. Furthermore, although the design examples detailed hereinabove relate to a LDMOS FET, the methods of the present invention may similarly be applied to other types of active devices with similar transfer characteristics, such as GaAs MESFET devices.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

Claims:

1. A radio-frequency (RF) power amplifier, comprising:
   an active device, which comprises:
     an input port, which is coupled to receive an RF input signal having a center frequency $f_0$ and a single-sided bandwidth BW; and
     an output port, which is characterized by an output capacitance $C_1$ and is coupled to output an amplified RF signal, responsive to the input signal, with a peak output power $P_{out}$; and
   a distortion suppression circuit, which is coupled between the output port and a ground, and comprises a transmission line having a characteristic impedance $Z_0$ that is selected so as to substantially satisfy a condition that $$Z_0 \leq \frac{f_0}{\pi BW} \cdot \frac{1}{\sqrt{\frac{P_{out}}{11.3}} + 4\pi BW \cdot C_1}.$$

2. The amplifier according to claim 1, wherein the transmission line has a length that is approximately equal to one quarter wavelength at the center frequency $f_0$.

3. The amplifier according to claim 1, wherein the distortion suppression circuit comprises a bypass capacitor, comprising first and second terminals, wherein the transmission line is coupled between the output port of the active device and the first terminal of the capacitor, and the second terminal of the capacitor is connected to the ground.

4. The amplifier according to claim 3, wherein the bypass capacitor has a capacitance that is at least twice the output capacitance $C_1$.

5. The amplifier according to claim 1, wherein a direct current (DC) bias is supplied to the output port of the active device via the transmission line comprised in the distortion suppression circuit.

6. The amplifier according to claim 1, wherein the distortion suppression circuit comprises a plurality of cascaded transmission lines, which includes the transmission line having the characteristic impedance $Z_0$.

7. The amplifier according to claim 1, wherein the distortion suppression circuit has an input impedance $Z_L$ in a baseband frequency range satisfying $$|Z_L| \leq 0.3 \sqrt{\frac{125}{P_{out}}}.$$

8. The amplifier according to claim 1, wherein the transmission line comprises a plurality of parallel conductive traces formed on a circuit substrate.

9. The amplifier according to claim 1, wherein the transmission line comprises a conductive rail, which is produced above a circuit substrate.

10. The amplifier according to claim 1, wherein the active device comprises a Field Effect Transistor (FET).

11. The amplifier according to claim 1, wherein the RF input signal comprises a code division multiple access (CDMA) signal.

12. A radio-frequency (RF) power amplifier, comprising:
an active device, which comprises:
an input port, which is coupled to receive an RF input signal having a center frequency $f_0$ and a single-sided bandwidth BW; and
an output port, which is characterized by an output capacitance $C_1$ and is coupled to output an amplified RF signal, responsive to the input signal, with a peak output power Pout; and
a distortion suppression circuit, which is coupled between the output port and a ground, and comprises an inductor having an inductance L that is selected so as to substantially satisfy a condition that $$L \leq \frac{1_0}{4\pi BW} \cdot \frac{1}{\sqrt{\frac{P_{out}}{11.3}} + 4\pi BW \cdot C_1}.$$

13. The amplifier according to claim 12, wherein the distortion suppression circuit comprises a bypass capacitor, comprising first and second terminals, wherein the inductor is coupled between the output port of the active device and the first terminal of the capacitor, and the second terminal of the capacitor is connected to the ground.

14. The amplifier according to claim 13, wherein the bypass capacitor has a capacitance that is at least twice the output capacitance $C_1$.

15. The amplifier according to claim 12, wherein a direct current (DC) bias is supplied to the output port of the active device via the inductor comprised in the distortion suppression circuit.

16. The amplifier according to claim 12, wherein the distortion suppression circuit has an input impedance $Z_L$ in a baseband frequency range satisfying $$|Z_L| \leq 0.3 \sqrt{\frac{125}{P_{out}}}.$$

17. The amplifier according to claim 12, wherein the RF input signal comprises a code division multiple access (CDMA) signal.

18. A method for producing a radio-frequency (RF) power amplifier to operate at a center frequency $f_0$ with a single-sided bandwidth BW, using an active device that includes an input port for receiving an RF input signal having, and an output port, which is characterized by an output capacitance $C_1$ and is coupled to output an amplified RF signal, responsive to the input signal, with a peak output power $P_{out}$, the method comprising:
determining a characteristic impedance $Z_0$ that is given by $$Z_0 \leq \frac{f_0}{\pi BW} \cdot \frac{1}{\sqrt{\frac{P_{out}}{11.3}} + 4\pi BW \cdot C_1};$$

and coupling a distortion suppression circuit comprising a transmission line having the characteristic impedance $Z_0$ between the output port of the active device and a ground.

19. The method according to claim 18, wherein the transmission line has a length that is approximately equal to one quarter wavelength at the center frequency $f_0$.

20. The method according to claim 18, wherein the distortion suppression circuit comprises a bypass capacitor, comprising first and second terminals, and wherein coupling the distortion suppression circuit comprises coupling the transmission line between the output port of the active device and the first terminal of the capacitor, and connecting the second terminal of the capacitor to the ground.

21. The method according to claim 20, wherein the bypass capacitor has a capacitance that is at least twice the output capacitance $C_1$.

22. The method according to claim 18, wherein coupling the distortion suppression circuit comprises coupling a DC bias through the distortion suppression circuit to the output port of the active device.

23. The method according to claim 18, wherein coupling the distortion suppression circuit comprises cascading a plurality of transmission lines, including the transmission line having the characteristic impedance $Z_0$, between the output port of the active device and the ground.

24. The method according to claim 18, wherein the distortion suppression circuit has an input impedance $Z_L$ in a baseband frequency range satisfying $$|Z_L| \leq 0.3 \sqrt{\frac{125}{P_{out}}}.$$

25. The method according to claim 18, wherein the active device comprises a Field Effect Transistor (FET).

26. The method according to claim 18, wherein the RF input signal comprises a code division multiple access (CDMA) signal.

27. A method for producing a radio-frequency (RF) power amplifier to operate at a center frequency $f_0$ with a single-sided bandwidth BW, using an active device that includes an input port for receiving an RF input signal having, and an output port, which is characterized by an output capacitance $C_1$ and is coupled to output an amplified RF signal, responsive to the input signal, with a peak output power $P_{out}$, the method comprising:

determining an inductance L that is given by $$L \le \frac{1}{4\pi BW} \cdot \frac{1}{\sqrt{\frac{P_{out}}{11.3}} + 4\pi BW \cdot C_1};$$

and coupling a distortion suppression circuit comprising an inductor having the inductance L between the output port of the active device and a ground.

28. The method according to claim 27, wherein the distortion suppression circuit comprises a bypass capacitor, comprising first and second terminals, and wherein coupling the distortion suppression circuit comprises coupling the inductor between the output port of the active device and the first terminal of the capacitor, and connecting the second terminal of the capacitor to the ground.

29. The method according to claim 28, wherein the bypass capacitor has a capacitance that is at least twice the output capacitance $C_1$.

30. The method according to claim 27, wherein coupling the distortion suppression circuit comprises coupling a DC bias through the distortion suppression circuit to the output port of the active device.

31. The method according to claim 27, wherein the distortion suppression circuit has an input impedance $Z_L$ in a baseband frequency range satisfying $$|Z_L| \le 0.3 \sqrt{\frac{125}{P_{out}}}.$$

32. The method according to claim 27, wherein the active device comprises a Field Effect Transistor (FET).

33. The method according to claim 27, wherein the RF input signal comprises a code division multiple access (CDMA) signal.

\* \* \* \* \*